US008569859B2

(12) United States Patent
Park et al.

(10) Patent No.: US 8,569,859 B2
(45) Date of Patent: Oct. 29, 2013

(54) DISPLAY DEVICE AND METHOD OF MANUFACTURING THE SAME

(75) Inventors: Byoung-Keon Park, Yongin (KR); Jin-Wook Seo, Yongin (KR); Ki-Yong Lee, Yongin (KR); Yun-Mo Chung, Yongin (KR); Jong-Ryuk Park, Yongin (KR); Tak-Young Lee, Yongin (KR); Dong-Hyun Lee, Yongin (KR); Kil-Won Lee, Yongin (KR); Byung-Soo So, Yongin (KR); Min-Jae Jeong, Yongin (KR); Yong-Duck Son, Yongin (KR); Seung-Kyu Park, Yongin (KR); Jae-Wan Jung, Yongin (KR)

(73) Assignee: Samsung Display Co., Ltd., Yongin (KR)

(*) Notice: Subject to any disclaimer, the term of this patent is extended or adjusted under 35 U.S.C. 154(b) by 261 days.

(21) Appl. No.: 13/034,818

(22) Filed: Feb. 25, 2011

(65) Prior Publication Data
US 2011/0227078 A1 Sep. 22, 2011

(30) Foreign Application Priority Data

Mar. 16, 2010 (KR) ........................ 10-2010-0023506

(51) Int. Cl.
*H01L 51/50* (2006.01)
(52) U.S. Cl.
USPC ............... 257/506; 257/40; 257/59; 257/510; 257/516; 257/532; 257/E33.004; 257/E51.018; 438/34; 438/99

(58) Field of Classification Search
USPC .............. 257/40, 59, 532, E33.004, E51.018; 438/34, 99
See application file for complete search history.

(56) References Cited

U.S. PATENT DOCUMENTS

| 5,917,247 | A | * | 6/1999 | Narita | 257/532 |
| 6,198,149 | B1 | * | 3/2001 | Ishigaki | 257/506 |
| 6,835,954 | B2 | * | 12/2004 | Park et al. | 257/72 |
| 7,285,459 | B2 | * | 10/2007 | Seo et al. | 438/239 |
| 7,692,245 | B2 | * | 4/2010 | Koo et al. | 257/350 |
| 8,106,402 | B2 | * | 1/2012 | Yeo et al. | 257/72 |
| 8,212,247 | B2 | * | 7/2012 | Kang et al. | 257/43 |
| 2009/0146147 | A1 | * | 6/2009 | Kim | 257/59 |
| 2012/0001182 | A1 | * | 1/2012 | Choi et al. | 257/59 |
| 2012/0043546 | A1 | * | 2/2012 | Oh et al. | 257/59 |

FOREIGN PATENT DOCUMENTS

| KR | 10-2003-0054795 | 7/2003 |
| KR | 10-2004-0079564 | 9/2004 |
| KR | 10-2005-0098123 | 10/2005 |
| KR | 10-2006-0057945 | 5/2006 |
| KR | 10-2009-0120698 | 11/2009 |

* cited by examiner

*Primary Examiner* — Allan R Wilson
(74) *Attorney, Agent, or Firm* — H.C. Park & Associates, PLC

(57) ABSTRACT

A display device including: a substrate; a first semiconductor layer disposed on the substrate; a second semiconductor layer disposed on the substrate and adjacent to the first semiconductor layer; a first insulation layer disposed on both the first semiconductor layer and the second semiconductor layer, the first insulation layer including a first opening forming a space between the first semiconductor layer and the second semiconductor layer; and a second insulation layer disposed on the first insulation layer and that fills the first opening.

13 Claims, 16 Drawing Sheets

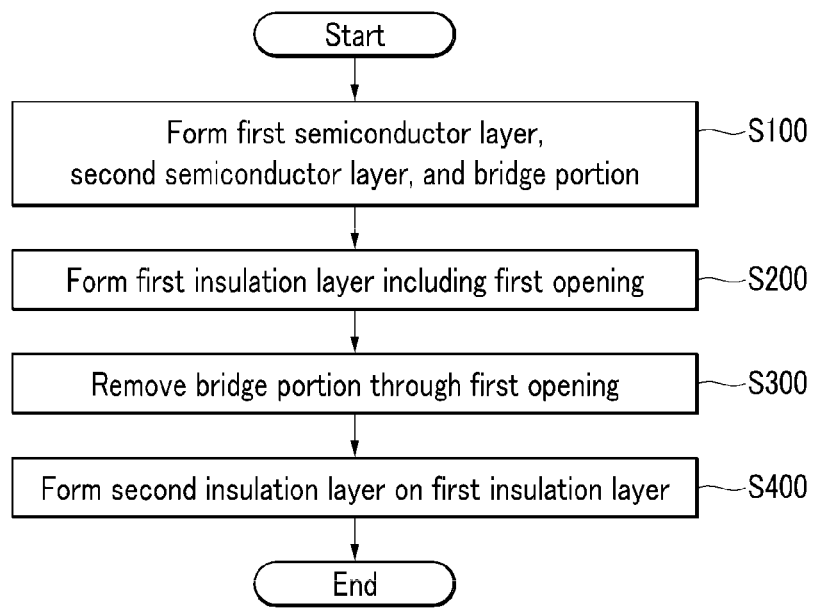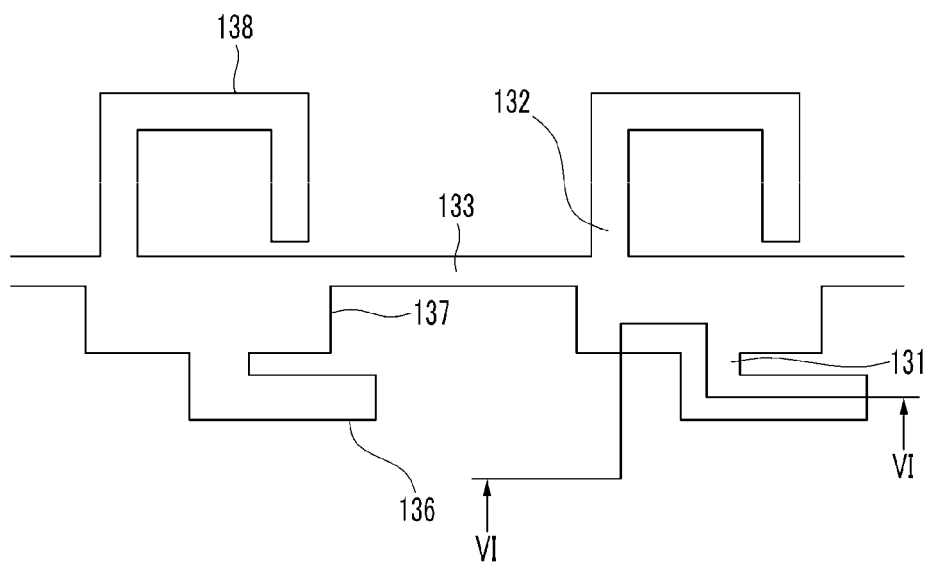

DISPLAY DEVICE AND METHOD OF MANUFACTURING THE SAME

CROSS-REFERENCE TO RELATED APPLICATION

This application claims the benefit of Korean Patent Application No. 10-2010-0023506, filed Mar. 16, 2010 in the Korean Intellectual Property Office, the disclosure of which is incorporated herein by reference.

BACKGROUND

1. Field

The described technology relates generally to a display device. More particularly, the described technology relates generally to a display device including a semiconductor layer, and a method of manufacturing the same.

2. Description of the Related Art

A display device is a device that displays an image. Recently, one type of display, an organic light emitting diode (OLED) display, has been in the spotlight. Unlike a liquid crystal display (LCD), the OLED display has a self-lightemitting characteristic and therefore does not require a separate light source, thereby reducing the thickness and weight thereof. Further, the OLED display has high quality characteristics such as low power consumption, high luminance, and a high reaction speed.

A conventional OLED display includes a plurality of thin film transistors that are formed in each pixel. An organic light emitting element is connected to at least one capacitor and thin film transistor. The plurality of thin film transistors and the at least one capacitor each include a semiconductor layer. Each semiconductor layer that is included in each thin film transistor and capacitor has an island form.

When manufacturing a conventional OLED display, after each semiconductor layer is formed in the island form, a subsequent process is performed. This process is a process of forming a thin film transistor, a process of forming a capacitor, or a process of forming an organic light emitting element. However, because each semiconductor layer constituting the conventional OLED display has the island form, there is a problem in that the semiconductor characteristics are deteriorated by static electricity that can occur in the subsequent process.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a display device and a method of manufacturing the same having advantages of minimizing deterioration of semiconductor characteristics by static electricity that is generated in a manufacturing process.

An exemplary embodiment provides a display device including: a substrate; a first semiconductor layer disposed on the substrate; a second semiconductor layer disposed on the substrate and adjacent to the first semiconductor layer; a first insulation layer disposed on both the first semiconductor layer and the second semiconductor, the first insulation layer including a first opening forming a space between the first semiconductor layer and the second semiconductor layer; and a second insulation layer disposed on the first insulation layer and that fills the first opening.

According to an embodiment, the first opening may be formed with a first inner surface and a second inner surface that are opposite to each other with the space interposed therebetween and a third inner surface and a fourth inner surface that are opposite to each other with the space interposed therebetween, the first inner surface may be formed with the first semiconductor layer, the second inner surface may be formed with the second semiconductor layer, and the third inner surface and the fourth inner surface may be formed with the first insulation layer.

According to an embodiment, the first insulation layer may further include a first contact hole and a second contact hole respectively exposing a first portion and a second portion of the first semiconductor layer.

According to an embodiment, the display device may further include a gate electrode disposed between the first semiconductor layer and the first insulation layer, and a source electrode and a drain electrode disposed between the first semiconductor layer and the second insulation layer, wherein the source electrode and the drain electrode are respectively connected to the first portion and the second portion of the first semiconductor layer through the first contact hole and the second contact hole of the first insulation layer.

According to an embodiment, the display device may further include a capacitor electrode disposed between the second semiconductor layer and the first insulation layer, wherein the capacitor electrode may be positioned at the same layer as that of the gate electrode.

According to an embodiment, the display device may further include a third semiconductor layer adjacent to the second semiconductor layer, wherein the first insulation layer may be disposed on the third semiconductor layer, wherein the first insulation layer may further include a second opening forming a space between the second semiconductor layer and the third semiconductor layer, and wherein the second insulation layer may fill the second opening.

According to an embodiment, the first semiconductor layer, the second semiconductor layer, and the third semiconductor layer may form one pixel, wherein the second semiconductor layer may be adjacent to a second semiconductor layer of another pixel that is adjacent to the pixel, wherein the first insulation layer may be disposed on the second semiconductor layer of the other pixel, wherein the first insulation layer may further include a third opening forming space between the second semiconductor layer and the second semiconductor layer of the other pixel, and wherein the second insulation layer may fill the third opening.

According to an embodiment, the display device may further include a first electrode connected to the drain electrode, an organic emission layer disposed on the first electrode, and a second electrode disposed on the organic emission layer.

Another embodiment provides a method of manufacturing a display device, the method including: forming a first semiconductor layer on a substrate; forming a second semiconductor layer adjacent to the first semiconductor layer; forming a bridge portion connecting between the first semiconductor layer and the second semiconductor layer on the substrate; forming a first insulation layer including a first opening exposing the bridge portion on the first semiconductor layer and the second semiconductor layer; forming a space between the first semiconductor layer and the second semiconductor layer by removing the bridge portion through the first opening; and forming a second insulation layer filling the first opening on the first insulation layer.

According to an embodiment, the forming of the first semiconductor layer may include forming a first contact hole and a second contact hole respectively exposing a first portion and a second portion of the first semiconductor layer, wherein the first opening may be simultaneously formed when forming the first contact hole and the second contact hole.

According to an embodiment, the method may further include: forming a gate electrode on the first semiconductor layer and between the first semiconductor layer and the first insulation layer; and forming a source electrode and a drain electrode that are respectively connected to the first portion and the second portion of the first semiconductor layer through the first contact hole and the second contact hole of the first insulation layer, wherein the source electrode and the drain electrode are formed on the first insulation layer and are disposed between the first insulation layer and the second insulation layer, and wherein the removing of the bridge portion through the first opening may be performed while forming the source electrode and the drain electrode.

According to an embodiment, the removing of the bridge portion through the first opening and the forming of the source electrode and the drain electrode may include: exposing the first semiconductor layer through the first contact hole and the second contact hole on the first insulation layer; forming a conductive layer contacting the bridge portion through the first opening; forming a photoresist pattern covering a portion of the conductive layer to be formed as the source electrode and the drain electrode; and forming the source electrode and the drain electrode and removing the bridge portion by etching the conductive layer having the photoresist pattern.

According to an embodiment, the method may further include: forming a gate electrode on the first semiconductor layer to be disposed between the first semiconductor layer and the first insulation layer; forming a source electrode and a drain electrode respectively connecting the first portion and the second portion of the first semiconductor layer through the first contact hole and the second contact hole of the first insulation layer; forming a dummy layer connected to the bridge portion through the first opening on the first insulation layer, the dummy layer disposed between the first insulation layer and the second insulation layer; and forming the first electrode connected to the drain electrode on the drain electrode, wherein the removing of the bridge portion through the first opening may be performed while forming the first electrode.

According to aspects and embodiments of the present invention, a display device and a method of manufacturing the same that minimize deterioration of semiconductor characteristics by static electricity that is generated in a manufacturing process are provided.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIG. 4 is a flowchart illustrating a method of manufacturing a display device according to a second exemplary embodiment.

FIGS. 5 to 12 are views illustrating a method of manufacturing a display device according to an exemplary embodiment.

DETAILED DESCRIPTION

Figure 1:
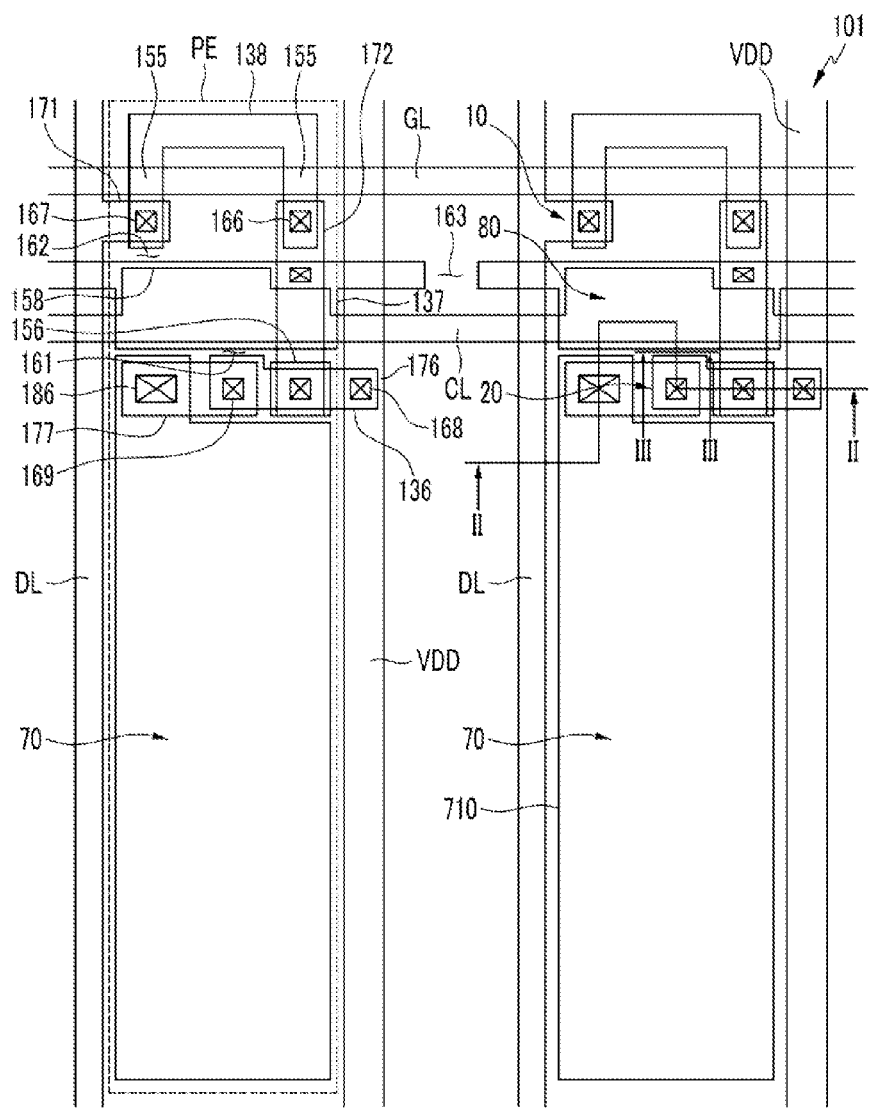
FIG. 1 is a layout view illustrating a pixel of a display device according to an exemplary embodiment.

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Further, in the drawings, a size and thickness of each element are randomly represented for better understanding and ease of description, and the present invention is not limited thereto. Specifically, in the drawings, the thickness of layers, films, panels, regions, etc., are exaggerated for clarity. Moreover, in the drawings, for better understanding and ease of description, thicknesses of some layers and areas are excessively displayed. When it is said that any part, such as a layer, film, region, or plate, is positioned on another part, it means the part is directly on the other part or above the other part with at least one intermediate part.

In addition, in the specification, unless explicitly described to the contrary, the word "comprise" and variations such as "comprises" or "comprising" will be understood to imply the inclusion of stated elements but not the exclusion of any other elements. Further, in the specification, an upper part of a target portion indicates an upper part or a lower part of the target portion, and it does not mean that the target portion is always positioned at the upper side based on a gravity direction.

Hereinafter, a display device 101 according to an exemplary embodiment will be described with reference to FIGS. 1 to 3. In the display device 101, the term "first insulation layer" indicates a gate insulating layer 140 and an interlayer insulating layer 160. The term "second insulation layer" indicates a planarization layer 180. Further, while the display device 101 is shown as an OLED display by way of example the present invention is not limited thereto. For instance, aspects can be applied to other layers, such as a liquid crystal display (LCD) including a thin film transistor having a semiconductor layer.

FIG. 1 is a layout view illustrating a pixel PE of the display device 101 according to an exemplary embodiment. As shown in FIG. 1, the display device 101 has a 2Tr-1Cap structure. In the 2Tr-1Cap structure, each pixel PE includes an organic light emitting diode 70, two thin film transistors (TFTs) 10 and 20, and one capacitor 80. Each pixel PE is defined by a capacitor line CL together with a gate line GL, a data line DL, and a common power source line VDD. However, the display device 101 is not limited thereto. Therefore, the display device 101 may have a structure in which three or more TFTs and two or more capacitors are disposed at each pixel PE, and may have various structures in which a separate wire is further formed. In this way, at least one of a TFT and a capacitor that are additionally formed may become an element of a compensation circuit.

The compensation circuit prevents a deviation from occurring in display quality by improving uniformity of an organic light emitting element 70 that is formed in each pixel PE. In general, the compensation circuit may include 2 to 8 TFTs. As shown in FIGS. 1 and 2, the organic light emitting element 70 includes a first electrode 710, a second electrode 730, and an organic emission layer 720. The first electrode 710 is an anode, which is a hole injection electrode. The second electrode 730 is a cathode, which is an electron injection electrode. The organic emission layer 720 is disposed between the first electrode 710 and the second electrode 730.

The display device 101 includes a first TFT 10 and a second TFT 20 in each pixel PE. The first TFT 10 is embodied as a switching TFT and the second TFT 20 is embodied as a driving TFT.

FIG. 1 illustrates the capacitor line CL together with a gate line GL, the data line DL, and the common power source line VDD, but the display device 101 is not limited to the structure that is shown in FIG. 1. For instance, the capacitor line CL may be omitted in other embodiments.

A configuration of such a pixel PE is not limited to the configuration that is described above, and can be variously changed within a range that can be easily determined by a person of ordinary skill in the art.

Hereinafter, the display device 101 will be described in detail according to a stacking order with reference to FIGS. 1 to 3. FIG. 2 is a cross-sectional view illustrating the pixel PE taken along line II-II of FIG. 1. FIG. 3 is a cross-sectional view illustrating the pixel PE taken along line III-III of FIG. 1.

Figure 2:
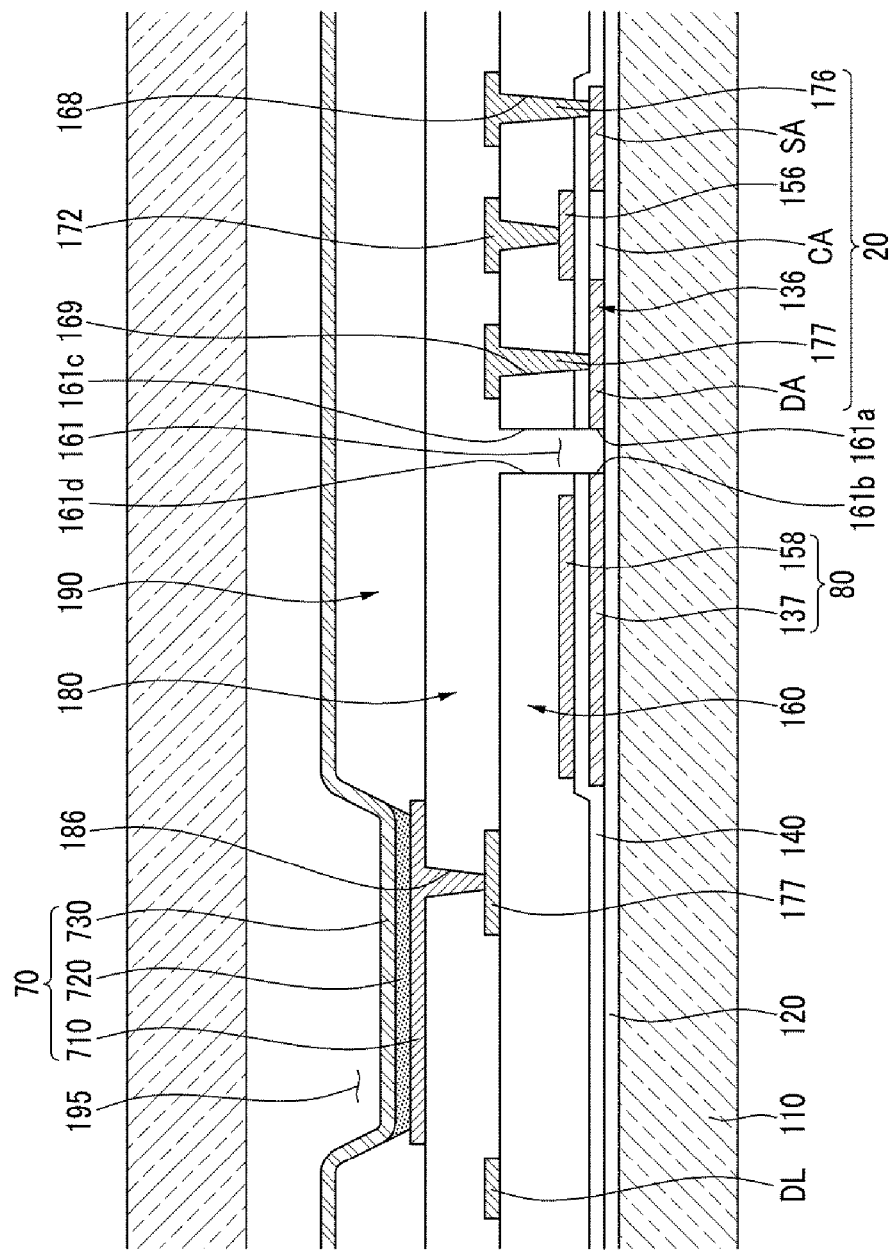
FIG. 2 is a cross-sectional view illustrating the pixel taken along line II-II of FIG. 1.

As shown in FIGS. 1 and 2, a substrate 110 is used. The substrate 110 may be an insulation substrate that is formed with glass, quartz, ceramic, plastic, etc. However, the display device 101 is not limited thereto. The substrate 110 may be a metal substrate that is formed with stainless steel, etc.

A buffer layer 120 is positioned on the substrate 110. The buffer layer 120 can be formed in a single layer structure of silicon nitride (SiNx), or a multilayer structure in which silicon nitride (SiNx) and silicon oxide (SiOx) are stacked. The buffer layer 120 performs a function of planarizing a surface while preventing penetration of an unnecessary component such as an impurity element or moisture. However, the buffer layer 120 is not always a necessary configuration and may be omitted according to a kind and process condition of the substrate 110.

A first semiconductor layer 136, a second semiconductor layer 137, and a third semiconductor layer 138 are positioned on the buffer layer 120. The first semiconductor layer 136, the second semiconductor layer 137, and the third semiconductor layer 138 may include polysilicon, and are formed in the same layer. The first semiconductor layer 136, the second semiconductor layer 137, and the third semiconductor layer 138 include polysilicon in which impurities are doped.

Specifically, the first semiconductor layer 136 and the third semiconductor layer 138 form the second TFT 20 and the first TFT 10, respectively. Each TFT 10, 20 is divided into a channel area CA, and a source area SA and a drain area DA that are formed at respective sides of the channel area CA. The channel area CA of the first semiconductor layer 136 and the third semiconductor layer 138 is an intrinsic semiconductor, which is a polysilicon layer in which impurities are not doped. The source area SA and the drain area DA of the first semiconductor layer 136 and the third semiconductor layer 138 are impurity semiconductors, which are polysilicon layers in which impurities are doped.

Further, the second semiconductor layer 137 forms the capacitor 80 and is formed with polysilicon in which impurities are doped, substantially identically to the source area SA and the drain area DA of the first semiconductor layer 136 and the third semiconductor layer 138. That is, when the source area SA and the drain area DA of the first semiconductor layer 136 and the third semiconductor layer 138 are formed, the second semiconductor layer 137 is formed together with the source area SA and the drain area DA.

The first semiconductor layer 136 and the second semiconductor layer 137 are adjacent to each other. The second semiconductor layer 137 and the third semiconductor layer 138 are adjacent to each other.

The gate insulating layer 140 is positioned on the buffer layer 120 and covers the first semiconductor layer 136, the second semiconductor layer 137, and the third semiconductor layer 138. The gate insulating layer 140 includes at least one of tetraethyl orthosilicate (TEOS), silicon nitride (SiNx), and silicon oxide (SiOx).

A first gate electrode 155, a second gate electrode 156, and a capacitor electrode 158 are formed on the gate insulating layer 140. The first gate electrode 155, the second gate electrode 156, and the capacitor electrode 158 are positioned at the same layer and are made of a substantially identical metallic material. In this case, the metallic material includes at least one of molybdenum (Mo), chromium (Cr), and tungsten (W). For example, the first gate electrode 155, the second gate electrode 156, and the capacitor electrode 158 may be formed with molybdenum (Mo) or an alloy including molybdenum (Mo).

The first gate electrode 155 and the second gate electrode 156 are positioned on the third semiconductor layer 138 and the first semiconductor layer 136, respectively, to be overlapped to the channel areas CA of each of the third semiconductor layer 138 and the first semiconductor layer 136. In a process of forming the third semiconductor layer 138 and the first semiconductor layer 136, when doping impurities in the source area SA and the drain area DA of each of the third semiconductor layer 138 and the first semiconductor layer 136, the first gate electrode 155 and the second gate electrode 156 perform a function of intercepting impurities from being doped in each channel area CA.

The capacitor electrode 158 is extended from the capacitor line CL and is positioned on the second semiconductor layer 137. The capacitor electrode 158 is positioned on the second semiconductor layer 137, but the capacitor electrode 158 is formed in a thickness thinner than that of the first gate electrode 155 and the second gate electrode 156 and thus impurities are doped in the second semiconductor layer 137 by passing through the capacitor electrode 158. In this way, as the capacitor electrode 158 is positioned on the second semiconductor layer 137 with the gate insulating layer 140 interposed therebetween, the capacitor 80 is completed. In this case, the gate insulating layer 140 becomes a dielectric material of the capacitor 80.

The interlayer insulating layer 160 is formed on the gate insulating layer 140 and covers the first gate electrode 155, the second gate electrode 156, and the capacitor electrode 158. The interlayer insulating layer 160 is formed with tetraethyl orthosilicate (TEOS), silicon nitride (SiNx), silicon oxide (SiOx) or so on, similarly to the gate insulating layer 140, but the interlayer insulating layer 160 is not limited thereto.

The interlayer insulating layer 160 includes a switching source contact hole 167 and a switching drain contact hole 166 that expose a portion of a source area and a drain area, respectively, of the third semiconductor layer 138 together with the gate insulating layer 140. The interlayer insulating layer 160 includes first contact hole 168 and a second contact hole 169 that expose a portion of the source area SA and the drain area DA, respectively, of the first semiconductor layer 136.

A switching source electrode 171 and a switching drain electrode 172 that are separated from each other and that contact the source area and the drain area of the third semiconductor layer 138 are positioned on the interlayer insulating layer 160 through the switching source contact hole 167 and the switching drain contact hole 166. A driving source electrode 176 and a driving drain electrode 177 that are separated from each other and that contact the source area SA and the drain area DA of the first semiconductor layer 136 through the first contact hole 168 and the second contact hole 169. Accordingly, the first TFT 10 and the second TFT 20 are formed.

Further, the interlayer insulating layer 160 includes a first opening 161, a second opening 162, and a third opening 163. The first opening 161 forms a space between the first semiconductor layer 136 and the second semiconductor layer 137 together with the gate insulating layer 140. The second opening 162 forms a space between the second semiconductor layer 137 and the third semiconductor layer 138. The third opening 163 forms a space between the second semiconductor layers 137 that are included in a pixel PE and a neighboring pixel PE.

Thus, the first semiconductor layer 136 and the second semiconductor layer 137 are separated from each other by the first opening 161, the second semiconductor layer 137 and the third semiconductor layer 138 are separated from each other by the second opening 162, and the second semiconductor layers 137 that are included in each of neighboring pixels PE are separated from each other by the third opening 163.

The first opening 161 is formed with a first inner surface 161a and a second inner surface 161b that are opposite to each other with a space that is formed by the between the first and second inner surfaces 161a, 161b. The first opening 161 also has a third inner surface 161c and a fourth inner surface 161d that are opposite to each other with a space interposed therebetween. At least a portion of the first inner surface 161a is formed with the first semiconductor layer 136, the second inner surface 161b is formed with the second semiconductor layer 137, and the third inner surface 161c and the fourth inner surface 161d are formed with the gate insulating layer 140 and the interlayer insulating layer 160. For better understanding and ease of description, only the first inner surface 161a, the second inner surface 161b, the third inner surface 161c, and the fourth inner surface 161d that form the first opening 161 are described, but each of the second opening 162 and the third opening 163 includes a first inner surface, a second inner surface, a third inner surface, and a fourth inner surface that form each of the second opening 162 and the third opening 163. In this way, as the first opening 161 is formed with the first inner surface 161a, the second inner surface 161b, the third inner surface 161c, and the fourth inner surface 161d, the first semiconductor layer 136 and the second semiconductor layer 137 are insulated.

The planarization layer 180 is on the interlayer insulating layer 160 and covers the switching source electrode 171, the switching drain electrode 172, the driving source electrode 176, and the driving drain electrode 177. The planarization layer 180 performs a function of removing a step difference and planarizing a surface in order to raise luminous efficiency of the organic light emitting element 70 to be formed thereon. The planarization layer 180 is positioned on the interlayer insulating layer 160 and fills the first opening 161, the second opening 162, and the third opening 163.

Further, the planarization layer 180 has an anode contact hole 186 that exposes a portion of the driving drain electrode 177. The planarization layer 180 includes at least one material of a polyacrylate resin, an epoxy resin, a phenolic resin, a polyamide resin, a polyimide resin, an unsaturated polyester resin, a poly(phenylenether) resin, a poly(phenylenesulfide) resin, and benzocyclobutene (BCB).

The first electrode 710 of the organic light emitting element 70 is positioned on the planarization layer 180. The first electrode 710 is connected to the driving drain electrode 177 through the anode contact hole 186 of the planarization layer 180.

Further, a pixel defining layer 190 is formed on the planarization layer 180. The pixel defining layer 190 has a pixel opening 195 that exposes the first electrode 710. That is, the first electrode 710 is disposed to correspond to the pixel opening 195 of the pixel defining layer 190. The pixel defining layer 190 includes a resin such as a polyacrylate or polyimide resin, and a silica-based inorganic substance.

The organic emission layer 720 is formed on the first electrode 710 within the pixel opening 195 of the pixel defining layer 190. The second electrode 730 is formed on the pixel defining layer 190 and the organic emission layer 720. Here, the second electrode 730 is a cathode. In this way, the organic light emitting element 70 including the first electrode 710, the organic emission layer 720, and the second electrode 730 is formed.

The display device 101 can have one structure of a front light emitting type, a rear light emitting type, and a both light emitting type according to a direction in which the organic light emitting element 70 emits light.

When the display device 101 is formed as a front light emitting type, the first electrode 710 is formed as a reflective layer and the second electrode 730 is formed as a transflective layer. Alternatively, when the display device 101 is formed as a rear light emitting type, the first electrode 710 is formed as a transflective layer and the second electrode 730 is formed in a reflective layer. Further, when the display device 101 is formed as a both light emitting type, the first electrode 710 and the second electrode 730 are formed as a transparent layer and/or a transflective layer.

The reflective layer and the transflective layer are formed using at least one metal of magnesium (Mg), silver (Ag), gold (Au), calcium (Ca), lithium (Li), chromium (Cr), and aluminum (Al), or alloys thereof. In this case, the reflective layer and the transflective layer can be determined by a thickness, and in general, a transflective layer has a thickness of 200 nm or less. When the transflective layer has a thin thickness, transmittance of light increases, and when the transflective layer has a thick thickness, transmittance of light decreases.

The transparent layer is formed using a material such as indium tin oxide (ITO), indium zinc oxide (IZO), zinc oxide (ZnO), or indium oxide ($In_2O_3$).

Further, the organic emission layer 720 is formed as a multilayer structure including at least one of a light emission layer, a hole-injection layer (HIL), a hole-transporting layer (HTL), an electron-transporting layer (ETL), and an electron-injection layer (EIL). When the organic emission layer 720 includes all such layers, the HIL is disposed on the first electrode 710 (which is an anode) and the HTL, the light emission layer, the ETL, and the EIL are sequentially stacked on the first electrode 710. Further, the organic emission layer 720 may further include another layer, as needed.

As described above, in the display device 101, the first semiconductor layer 136, the second semiconductor layer 137, and the third semiconductor layer 138 are formed in island forms that are separated from each other by one of the first opening 161, the second opening 162, and the third opening 163 in the gate insulating layer 140 and the interlayer insulating layer 160 (i.e., the first insulation layer). The first opening 161, the second opening 162, and the third opening 163 are filled with the planarization layer 180 (i.e., the second insulation layer). In the display device 101, the first semiconductor layer 136, the second semiconductor layer 137, and the third semiconductor layer 138 constituting a pixel PE are formed in island forms, but semiconductor characteristics of the first semiconductor layer 136, the second semiconductor layer 137, and the third semiconductor layer 138 are not deteriorated by static electricity that is generated in a manufacturing process, and the reason thereof will be described through a manufacturing method to be described later.

Hereinafter, a method of manufacturing a display device according to another exemplary embodiment will be described with reference to FIGS. 4 to 12. A method of manufacturing a display device according to the exemplary embodiment of FIGS. 4 to 12 is similar to the method of manufacturing the display device 101 according to the embodiment shown in FIGS. 1 to 3.

Figure 6:
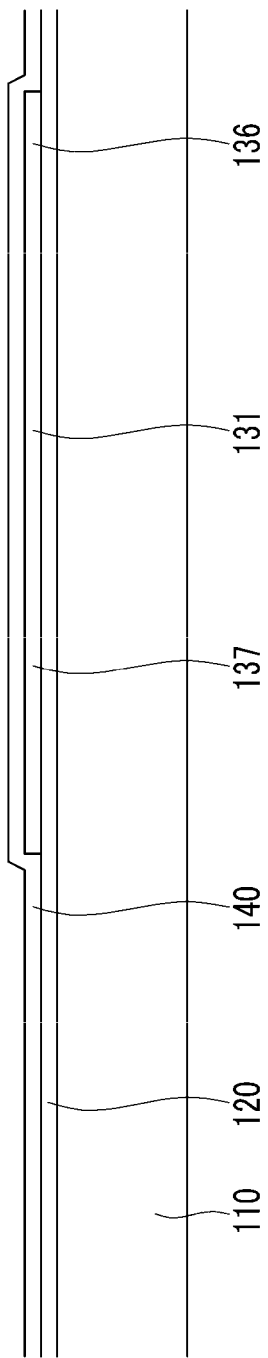

FIG. 4 is a flowchart illustrating a method of manufacturing a display device according to an exemplary embodiment. FIGS. 5 to 12 are views illustrating a method of manufacturing a display device according to an exemplary embodiment. FIG. 6 is a cross-sectional view illustrating the display device taken along line VI-VI of FIG. 5. FIG. 8 is a cross-sectional view illustrating the display device taken along line VIII-VIII of FIG. 7. FIG. 11 is a cross-sectional view illustrating the display device taken along line XI-XI of FIG. 10.

As shown in FIGS. 4 to 6, a first semiconductor layer 136, a second semiconductor layer 137, a third semiconductor layer 138, a first bridge portion 131, a second bridge portion 132, and a third bridge portion 133 are formed (S100).

Specifically, after a buffer layer 120 is formed on a substrate 110 and an amorphous silicon layer is formed on the buffer layer 120, the amorphous silicon layer is patterned using microelectromechanical systems (MEMS) technology such as a photolithography process. The patterning results in the first semiconductor layer 136, the second semiconductor layer 137, the third semiconductor layer 138, the first bridge portion 131, the second bridge portion 132, and the third bridge portion 133 being formed. In this case, the first semiconductor layer 136, the second semiconductor layer 137, the third semiconductor layer 138, the first bridge portion 131, the second bridge portion 132, and the third bridge portion 133 are integrally formed. In more detail, the first bridge portion 131 connects the first semiconductor layer 136 and the second semiconductor layer 137, the second bridge portion 132 connects the second semiconductor layer 137 and the third semiconductor layer 138, and the third bridge portion 133 connects second semiconductor layers 137 of neighboring pixels. When the amorphous silicon layer is formed with the first semiconductor layer 136, the second semiconductor layer 137, the third semiconductor layer 138, the first bridge portion 131, the second bridge portion 132, and the third bridge portion 133, after the amorphous silicon layer is formed as a polysilicon layer using a laser or a metal catalyst, the polysilicon layer can be formed with the first semiconductor layer 136, the second semiconductor layer 137, the third semiconductor layer 138, the first bridge portion 131, the second bridge portion 132, and the third bridge portion 133.

In this way, as the first semiconductor layer 136, the second semiconductor layer 137, the third semiconductor layer 138, the first bridge portion 131, the second bridge portion 132, and the third bridge portion 133 are integrally formed, static electricity occurs in a process to be performed later. Thus, even if static electricity applies an impact to any one portion of the first semiconductor layer 136, the second semiconductor layer 137, the third semiconductor layer 138, the first bridge portion 131, the second bridge portion 132, and the third bridge portion 133, the static electricity is emitted through the first semiconductor layer 136, the second semiconductor layer 137, the third semiconductor layer 138, the first bridge portion 131, the second bridge portion 132, and the third bridge portion 133 that are integrally formed, whereby deterioration of the semiconductor characteristics of the first semiconductor layer 136, the second semiconductor layer 137, and the third semiconductor layer 138 is minimized.

Figure 7:
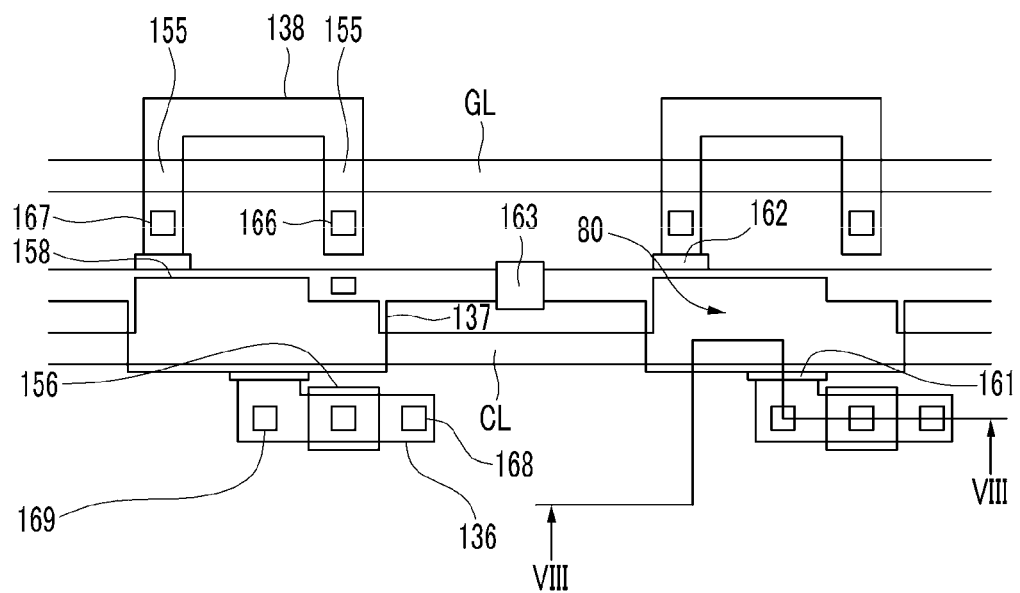
Figure 8:
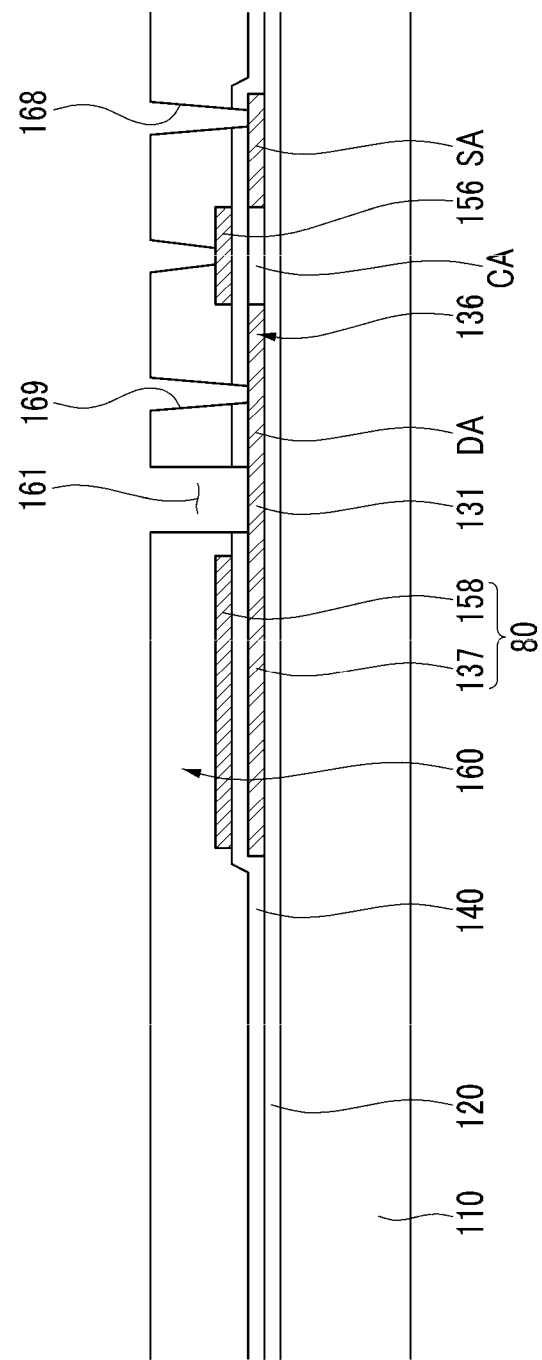
Figure 9:
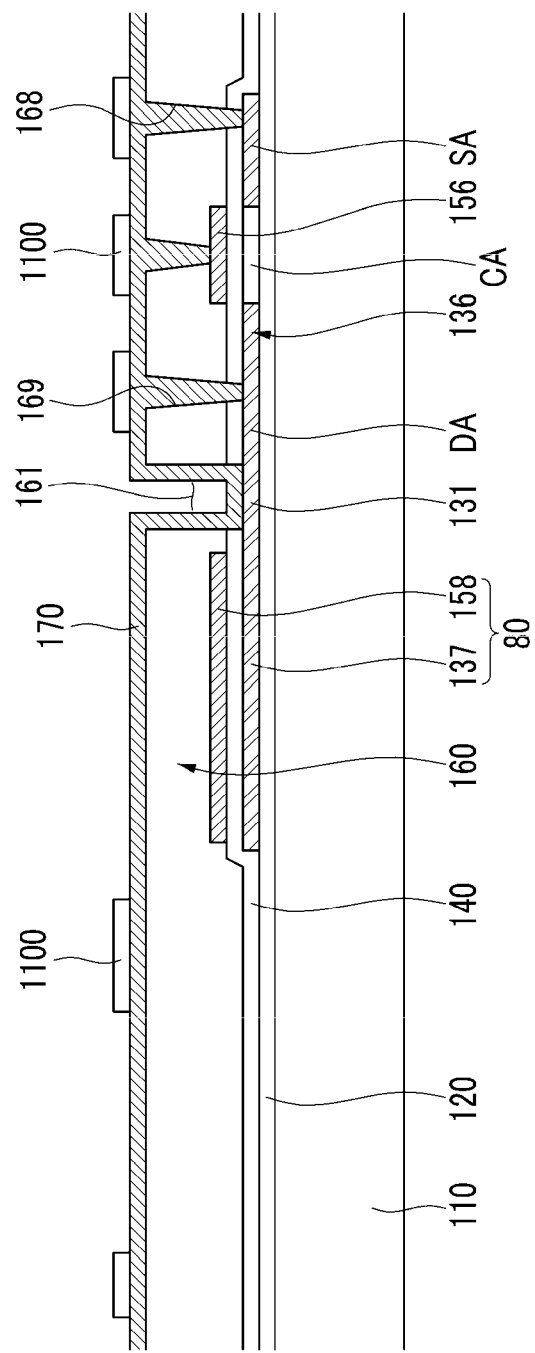

Next, as shown in FIGS. 7 to 9, the gate insulating layer 140 and the interlayer insulating layer 160 are formed as the first insulation layer (S200). Specifically, as shown in FIGS. 7 and 8, after the gate insulating layer 140 is formed on the first semiconductor layer 136, the second semiconductor layer 137, the third semiconductor layer 138, the first bridge portion 131, the second bridge portion 132, and the third bridge portion 133, and the gate line GL, the first gate electrode 155, the second gate electrode 156, the capacitor line CL, and the capacitor electrode 158 are formed on the gate insulating layer 140, by doping impurities to each of the first semiconductor layer 136 and the third semiconductor layer 138 using each of the first gate electrode 155 and the second gate electrode 156 as a mask. The source area SA, the channel area CA, and the drain area DA are formed in each of the first semiconductor layer 136 and the third semiconductor layer 138. Thereafter, the interlayer insulating layer 160 is formed on the gate line GL, the first gate electrode 155, the second gate electrode 156, the capacitor line CL, and the capacitor electrode 158. By patterning the gate insulating layer 140 and the interlayer insulating layer 160 using MEMS technology such as a photolithography process, a switching source contact hole 167 and a switching drain contact hole 166 that expose a portion of a source area and a drain area, respectively, of the third semiconductor layer 138, a first contact hole 168 and a second contact hole 169 that expose a portion of the source area SA, which is a first portion of the first semiconductor layer 136 and a drain area DA, which is a second portion, respectively, of the first semiconductor layer 136, a first opening 161 that exposes the first bridge portion 131, a second opening 162 that exposes the second bridge portion 132, and a third opening 163 that exposes the third bridge portion 133 are formed. That is, when forming the switching source contact hole 167, the switching drain contact hole 166, the first contact hole 168, and the second contact hole 169 by patterning the gate insulating layer 140 and the interlayer insulating layer 160, which are the first insulation layer, the first opening 161, the second opening 162, and the third opening 163 are simultaneously formed.

Thereafter, as shown in FIG. 9, a conductive layer 170 is formed on the interlayer insulating layer 160. In this case, the conductive layer 170 contacts the third semiconductor layer 138 through the switching source contact hole 167 and the switching drain contact hole 166, contacts the first semiconductor layer 136 through the first contact hole 168 and the second contact hole 169, contacts the first bridge portion 131 through the first opening 161, contacts the second bridge portion 132 through the second opening 162, and contacts the third bridge portion 133 through the third opening 163.

Figure 10:
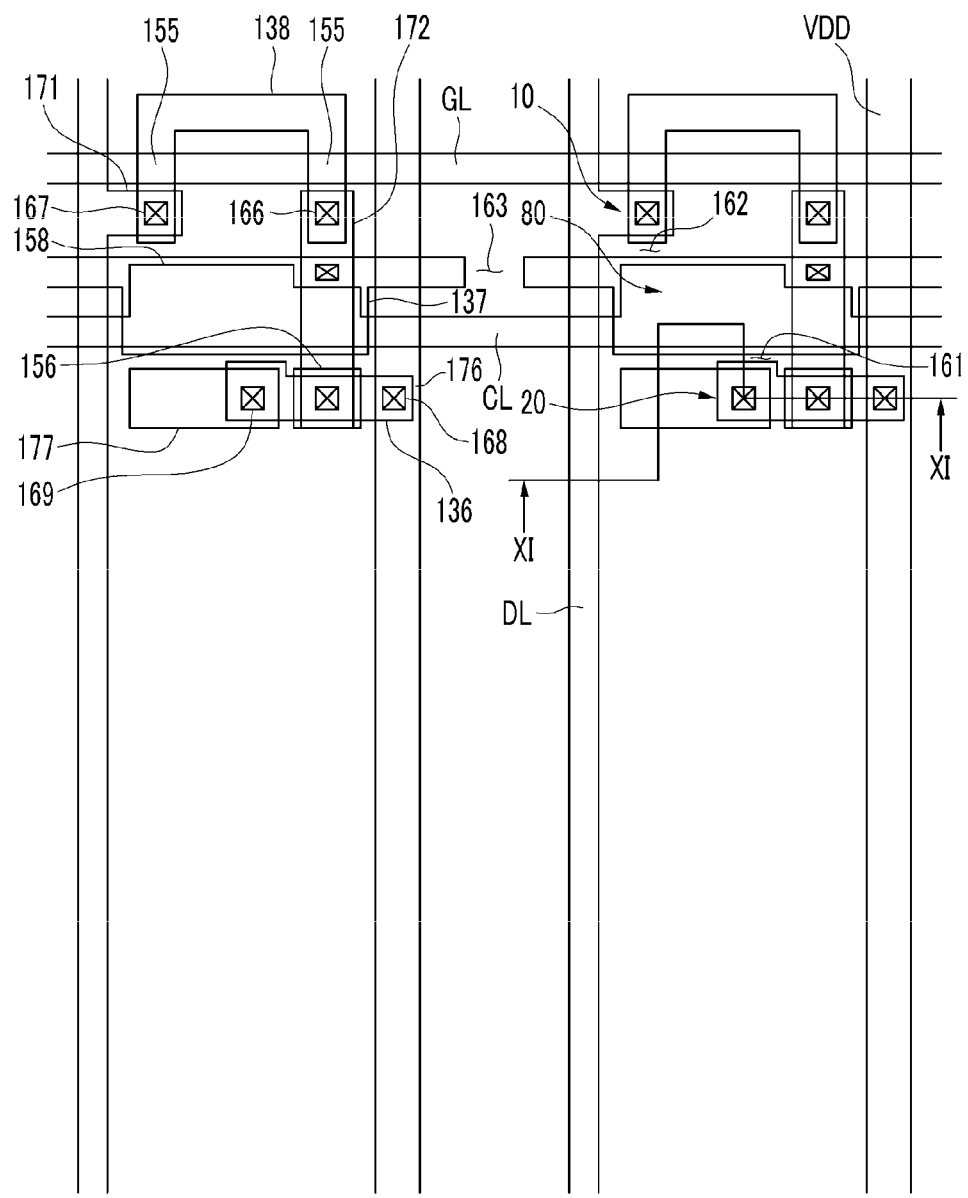
Figure 11:
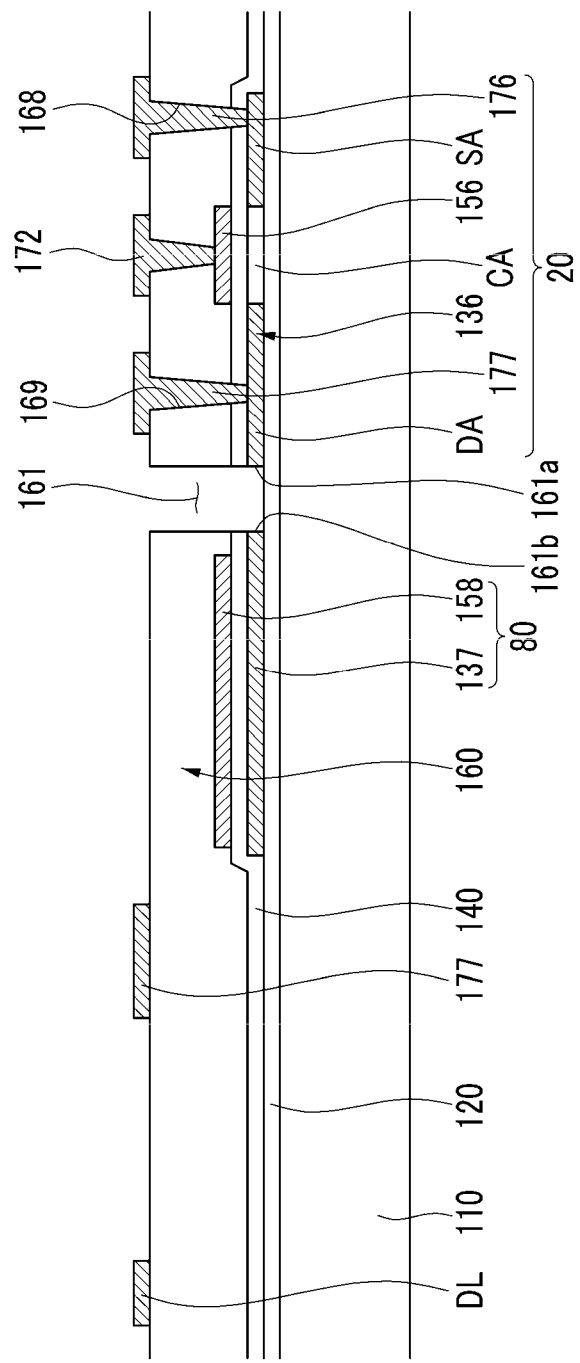
Figure 12:
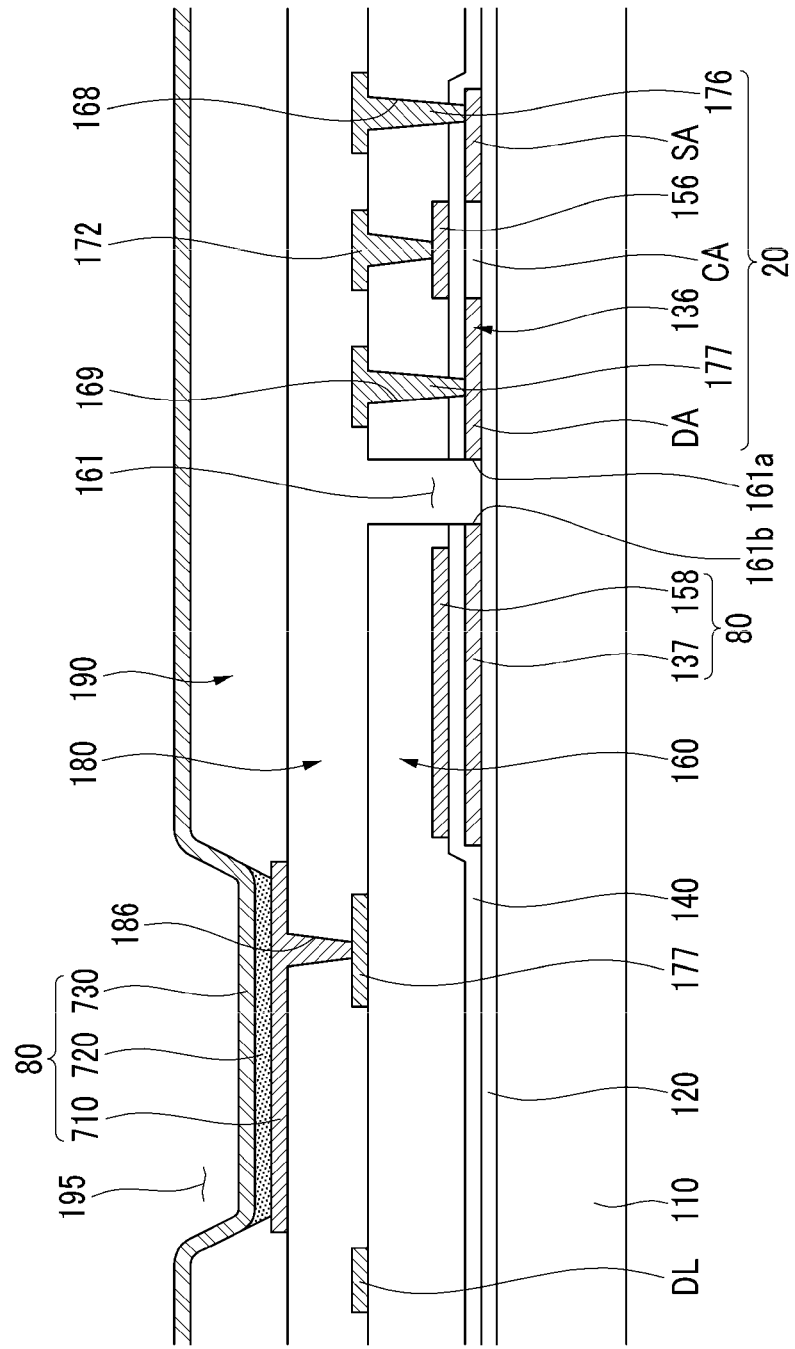

In this way, after the conductive layer 170 is formed on the interlayer insulating layer 160, a first photoresist pattern 1100 that covers a portion to be formed as the data line DL, the switching source electrode 171, the switching drain electrode 172, the driving power source line VDD, the driving source electrode 176, and the driving drain electrode 177 that are shown in FIG. 10 is formed on the conductive layer 170.

Next, as shown in FIGS. 10 and 11, the first bridge portion 131, the second bridge portion 132, and the third bridge portion 133 are removed through the first opening 161, the second opening 162, and the third opening 163, respectively (S300).

Specifically, by performing wet etching or dry etching of the conductive layer 170 using the first photoresist pattern 1100 as a mask, the data line DL, the switching source electrode 171, the switching drain electrode 172, the driving power source line VDD, the driving source electrode 176, and the driving drain electrode 177 are formed from the conductive layer 170. Thereafter, when the conductive layer 170 is etched, by removing the first bridge portion 131, the second bridge portion 132, and the third bridge portion 133 that are exposed by the first opening 161, the second opening 162, and the third opening 163, respectively, by performing wet etching or dry etching, a space is formed between the first semiconductor layer 136 and the second semiconductor layer 137, between the second semiconductor layer 137 and the third semiconductor layer 138, and between the second semiconductor layers 137 between neighboring pixels, and thus the first semiconductor layer 136, the second semiconductor layer 137, and the third semiconductor layer 138 that are separated from each other in island forms are formed.

A process of removing the first bridge portion 131, the second bridge portion 132, and the third bridge portion 133 by performing wet etching or dry etching is simultaneously performed with a process of forming the data line DL, the switching source electrode 171, the switching drain electrode 172, the driving power source line VDD, the driving source electrode 176, and the driving drain electrode 177 from the conductive layer 170 by performing wet etching or dry etching of the conductive layer 170.

In this way, until a process of forming the data line DL, the switching source electrode 171, the switching drain electrode 172, the driving power source line VDD, the driving source electrode 176, and the driving drain electrode 177, the first semiconductor layer 136, the second semiconductor layer 137, and the third semiconductor layer 138 are connected by any one of the first bridge portion 131, the second bridge portion 132, and the third bridge portion 133. Thus, even if static electricity that is generated in a process applies an impact to any one portion of the first semiconductor layer 136, the second semiconductor layer 137, the third semiconductor layer 138, the first bridge portion 131, the second bridge portion 132, and the third bridge portion 133, the static electricity is emitted through the first semiconductor layer 136, the second semiconductor layer 137, the third semiconductor layer 138, the first bridge portion 131, the second bridge portion 132, and the third bridge portion 133 that are integrally formed. Thus, deterioration of the semiconductor characteristics of the first semiconductor layer 136, the second semiconductor layer 137, and the third semiconductor layer 138 is minimized.

Next, a planarization layer 180 is formed as the second insulation layer (S400). Specifically, the planarization layer 180 as the second insulation layer is formed on the interlayer insulating layer 160 as the first insulation layer with the data line DL, the switching source electrode 171, the switching drain electrode 172, the driving power source line VDD, the driving source electrode 176, and the driving drain electrode 177 interposed therebetween. The planarization layer 180 is positioned on the data line DL, the switching source electrode 171, the switching drain electrode 172, the driving power source line VDD, the driving source electrode 176, and the driving drain electrode 177, and fills the first opening 161, the second opening 162, and the third opening 163 in which the first bridge portion 131, the second bridge portion 132, and the third bridge portion 133, respectively, are removed. That is, the planarization layer 180 fills a space between the first semiconductor layer 136, the second semiconductor layer 137, and the third semiconductor layer 138.

In this way, even though each of the first semiconductor layer 136, the second semiconductor layer 137, and the third semiconductor layer 138 is separated from each other in an island form, a space between the first semiconductor layer 136, the second semiconductor layer 137, and the third semiconductor layer 138 is filled by the planarization layer 180 as the second insulation layer. Thus, each of the first semiconductor layer 136, the second semiconductor layer 137, and the third semiconductor layer 138 is insulated by the gate insulating layer 140 and the interlayer insulating layer 160 as the first insulation layer and by the planarization layer 180 as the second insulation layer. That is, even though each of the first semiconductor layer 136, the second semiconductor layer 137, and the third semiconductor layer 138 is separated from each other in an island form, the first semiconductor layer 136, the second semiconductor layer 137, and the third semiconductor layer 138 are insulated by the gate insulating layer 140 and the interlayer insulating layer 160 as the first insulation layer and by the planarization layer 180 as the second insulation layer. Thus, the first semiconductor layer 136, the second semiconductor layer 137, and the third semiconductor layer 138 are prevented from receiving an impact by static electricity that can be generated in a process to be performed later. This minimizes the deterioration of the semiconductor characteristics of the first semiconductor layer 136, the second semiconductor layer 137, and the third semiconductor layer 138.

Figure 3:
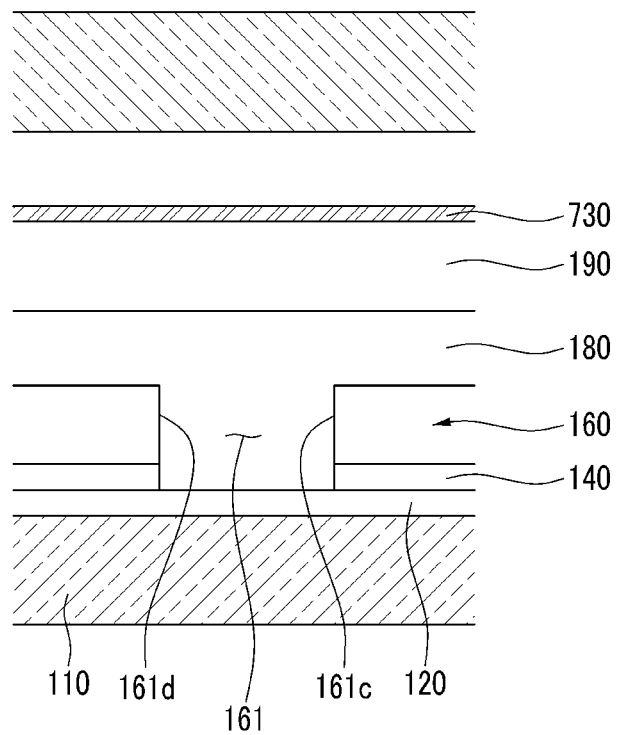
FIG. 3 is a cross-sectional view illustrating the pixel taken along line III-III of FIG. 1.

Thereafter, by forming an anode contact hole 186 that exposes the driving drain electrode 177 in the planarization layer 180 and by forming the organic light emitting element 70 including the first electrode 710, the organic emission layer 720, and the second electrode 730 that connect to the driving drain electrode 177 on the planarization layer 180 through the anode contact hole 186, the display device 101 shown in FIGS. 1 to 3 is manufactured.

As described above, in a method of manufacturing a display device according to the embodiment shown in FIGS. 4 to 12, until the first semiconductor layer 136, the second semiconductor layer 137, and the third semiconductor layer 138 are covered by the gate insulating layer 140 and the interlayer insulating layer 160 as the first insulation layer, the first semiconductor layer 136, the second semiconductor layer 137, and the third semiconductor layer 138 are integrally formed by the first bridge portion 131, the second bridge portion 132, and the third bridge portion 133. Thus, even if an impact is applied to the first semiconductor layer 136, the second semiconductor layer 137, and the third semiconductor layer 138 by static electricity that is generated in a process, deterioration of the semiconductor characteristics of the first semiconductor layer 136, the second semiconductor layer 137, and the third semiconductor layer 138 is minimized. Further, even if the first semiconductor layer 136, the second semiconductor layer 137, and the third semiconductor layer 138 are formed in island forms that are separated from each other, the gate insulating layer 140 and the interlayer insulating layer 160 are covered as the first insulation layer on the first semiconductor layer 136, the second semiconductor layer 137, and the third semiconductor layer 138, and the planarization layer 180 as the second insulation layer are filled in a space that is formed between the first semiconductor layer 136, the second semiconductor layer 137, and the third semiconductor layer 138. Thus, static electricity generated in a process is prevented from being applied to the first semiconductor layer 136, the second semiconductor layer 137, and the third semiconductor layer 138.

That is, in the method of manufacturing a display device, the first semiconductor layer 136, the second semiconductor layer 137, and the third semiconductor layer 138 are prevented from receiving an impact by static electricity that can be generated in a process, such that semiconductor characteristics of the first semiconductor layer 136, the second semiconductor layer 137, and the third semiconductor layer 138 are not deteriorated. This operates as a factor of improving display quality of an entire display device.

Hereinafter, a method of manufacturing a display device according to another exemplary embodiment will be described with reference to FIGS. 13 to 17. Only characteristic portions that are different from the method of manufacturing a display device according to the exemplary embodiment are shown in FIGS. 4 to 12 described, and portions in which a description is omitted are manufactured by the method of manufacturing a display device according to the second exemplary embodiment shown in FIGS. 4 to 12.

Figure 13:
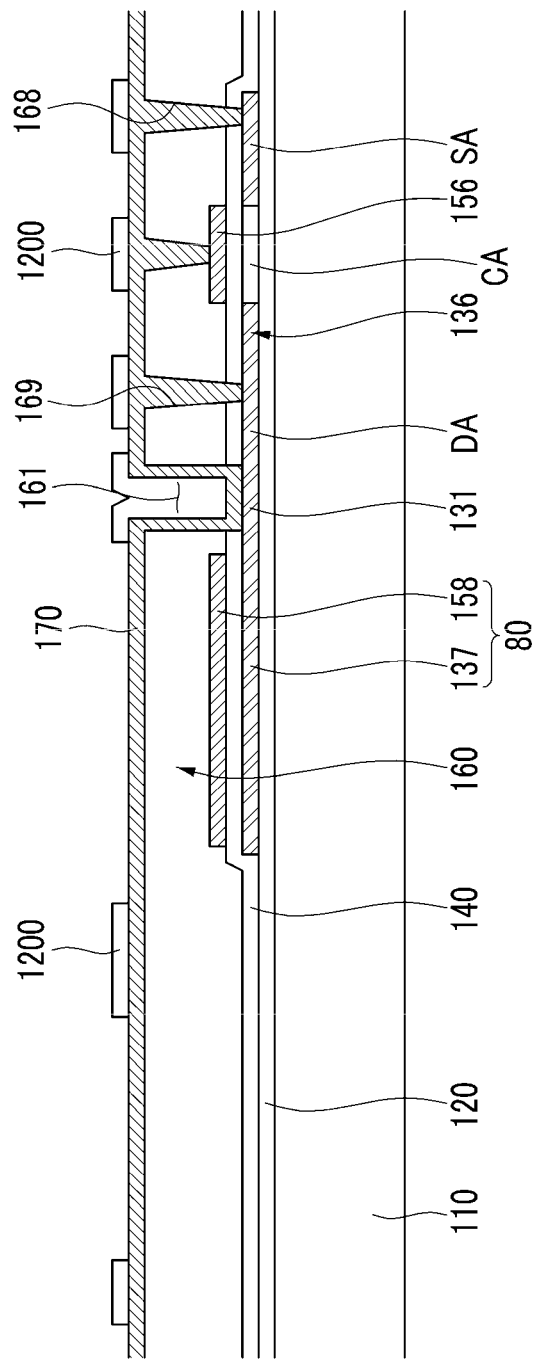
FIGS. 13 to 17 are cross-sectional views illustrating a method of manufacturing a display device according to an exemplary embodiment.

As shown in FIG. 13, a buffer layer 120 is formed on a substrate 110 and a first semiconductor layer 136, a second semiconductor layer 137, a third semiconductor layer 138, a first bridge portion 131, a second bridge portion 132, and a third bridge portion 133 are formed on the buffer layer 120. A gate insulating layer 140 is formed on the first semiconductor layer 136, the second semiconductor layer 137, the third semiconductor layer 138, the first bridge portion 131, the second bridge portion 132, and the third bridge portion 133. A gate line GL, a first gate electrode 155, a second gate electrode 156, a capacitor line CL, and a capacitor electrode 158 are formed on the gate insulating layer 140. An interlayer insulating layer 160 is formed on the gate line GL, the first gate electrode 155, the second gate electrode 156, the capacitor line CL, and the capacitor electrode 158. Thereafter, by patterning the gate insulating layer 140 and the interlayer insulating layer 160, the switching source contact hole 167, the switching drain contact hole 166, the first contact hole 168, the second contact hole 169, the first opening 161, the second opening 162, and the third opening 163 are formed. The conductive layer 170 is formed on the interlayer insulating layer 160. In this case, the conductive layer 170 contacts the third semiconductor layer 138 through the switching source contact hole 167 and the switching drain contact hole 166, contacts the first semiconductor layer 136 through the first contact hole 168 and the second contact hole 169, contacts the first bridge portion 131 through the first opening 161, contacts the second bridge portion 132 through the second opening 162, and contacts the third bridge portion 133 through the third opening 163.

In this way, after the conductive layer 170 is formed on the interlayer insulating layer 160, a second photoresist pattern 1200 that covers a portion to be formed as the data line DL, the switching source electrode 171, the switching drain electrode 172, the driving power source line VDD, the driving source electrode 176, and the driving drain electrode 177 is formed on the conductive layer 170. In this case, the second photoresist pattern 1200 is also formed to cover the conductive layer 170 corresponding to the first opening 161, the second opening 162, and the third opening 163.

Figure 14:
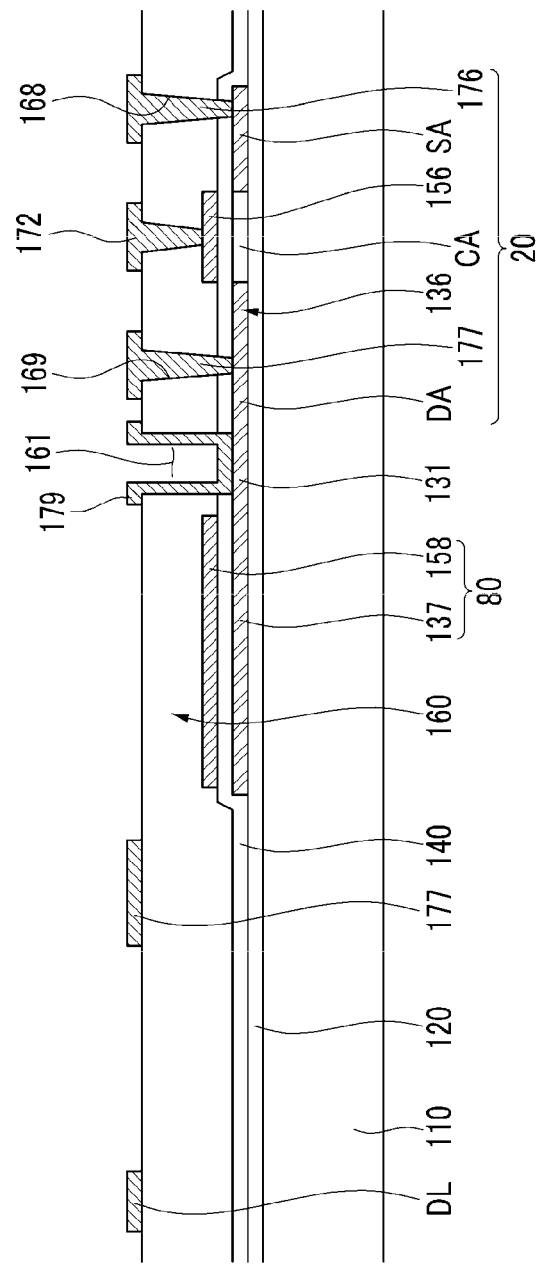

Next, as shown in FIG. 14, by performing wet etching or dry etching of the conductive layer 170 using the second photoresist pattern 1200 as a mask, while the data line DL, the switching source electrode 171, the switching drain electrode 172, the driving power source line VDD, the driving source electrode 176, and the driving drain electrode 177 are formed from the conductive layer 170, a first dummy layer 179, a second dummy layer, and a third dummy layer that are connected to the first bridge portion 131, the second bridge portion 132, and the third bridge portion 133 are formed through the first opening 161, the second opening 162, and the third opening 163, respectively, from the conductive layer 170. That is, the first dummy layer 179, the second dummy layer, and the third dummy layer are positioned at the same layer as that of the data line DL, the switching source electrode 171, the switching drain electrode 172, the driving power source line VDD, the driving source electrode 176, and the driving drain electrode 177.

Figure 15:
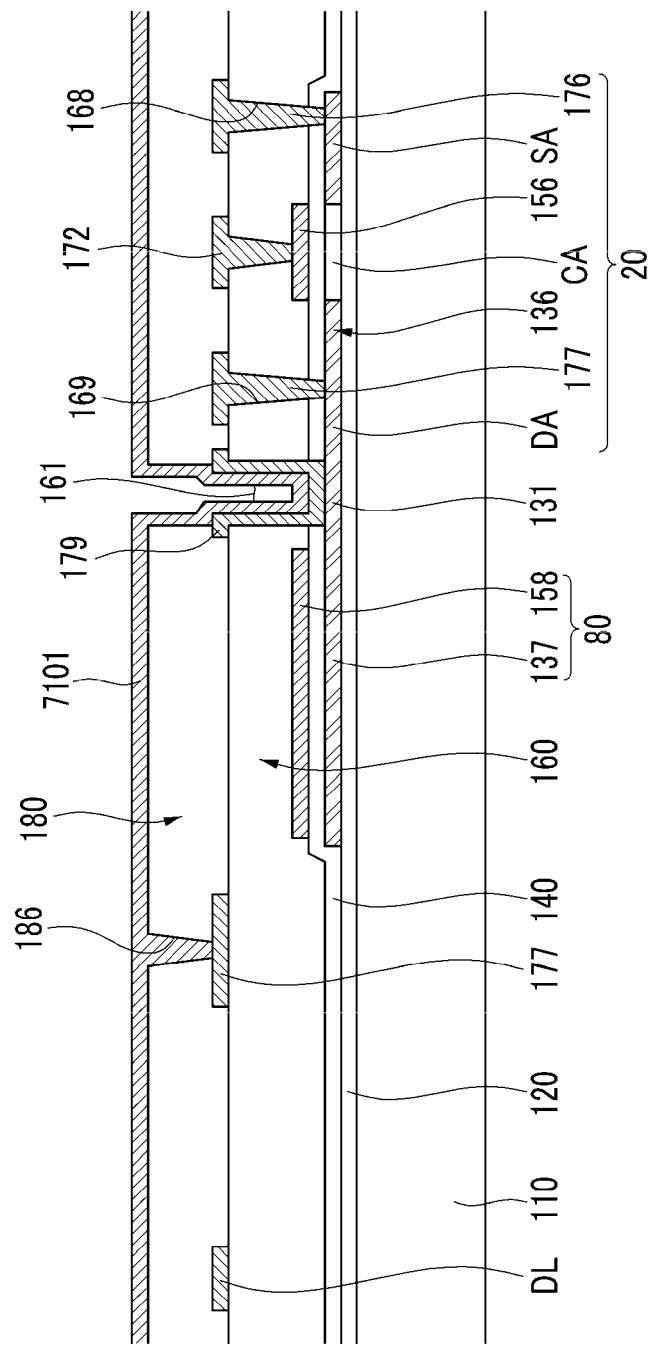

Next, as shown in FIG. 15, the planarization layer 180 is formed on the data line DL, the switching source electrode 171, the switching drain electrode 172, the driving power source line VDD, the driving source electrode 176, the driving drain electrode 177, the first dummy layer 179, the second dummy layer, and the third dummy layer. Thereafter, an anode contact hole 186 that exposes the driving drain electrode 177 is formed. A dummy hole 189 that exposes each of the first dummy layer 179 corresponding to the first opening 161, the second dummy layer corresponding to the second opening 162, and the third dummy layer corresponding to the third opening 163 is formed. That is, the dummy hole 189 is simultaneously formed with the anode contact hole 186. Thereafter, an electrode layer 7101 is formed on the planarization layer 180, and the electrode layer 7101 contacts each of the first dummy layer 179, the second dummy layer, and the third dummy layer through the dummy hole 189 while being connected to the driving drain electrode 177 through the anode contact hole 186.

Figure 16:
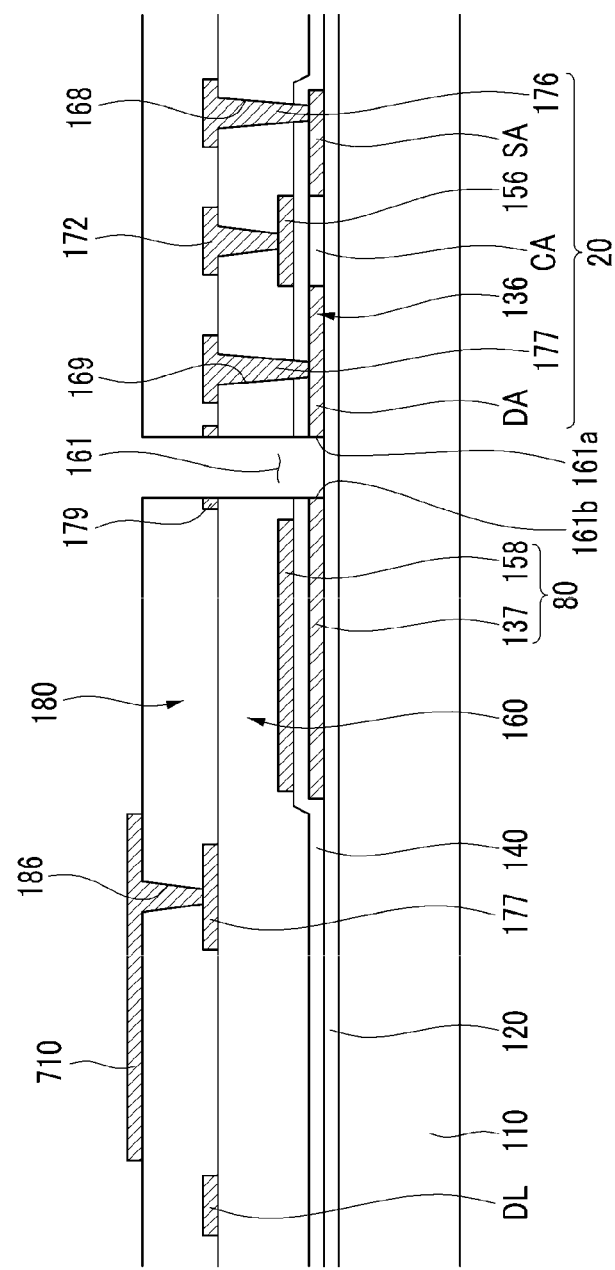

Next, as shown in FIG. 16, by patterning the electrode layer 7101 using MEMS technology (such as a photolithography process), the first electrode 710 is formed from the electrode layer 7101. In this case, portions of the electrode layer 7101 corresponding to each of the first opening 161, the second opening 162, and the third opening 163 are first removed, and thereafter, a portion or all of the first dummy layer 179, the second dummy layer, and the third dummy layer corresponding to the first opening 161, the second opening 162, and the third opening 163, respectively, is removed. The first bridge portion 131, the second bridge portion 132, and the third bridge portion 133 that are exposed by removing the first dummy layer 179, the second dummy layer, and the third dummy layer are removed. Thus, the first semiconductor layer 136, the second semiconductor layer 137, and the third semiconductor layer 138 are formed in island forms that are separated from each other. That is, when the first bridge portion 131, the second bridge portion 132, and the third bridge portion 133 form the first electrode 710 from the electrode layer 7101, the first bridge portion 131, the second bridge portion 132, and the third bridge portion 133 are simultaneously removed.

Figure 17:
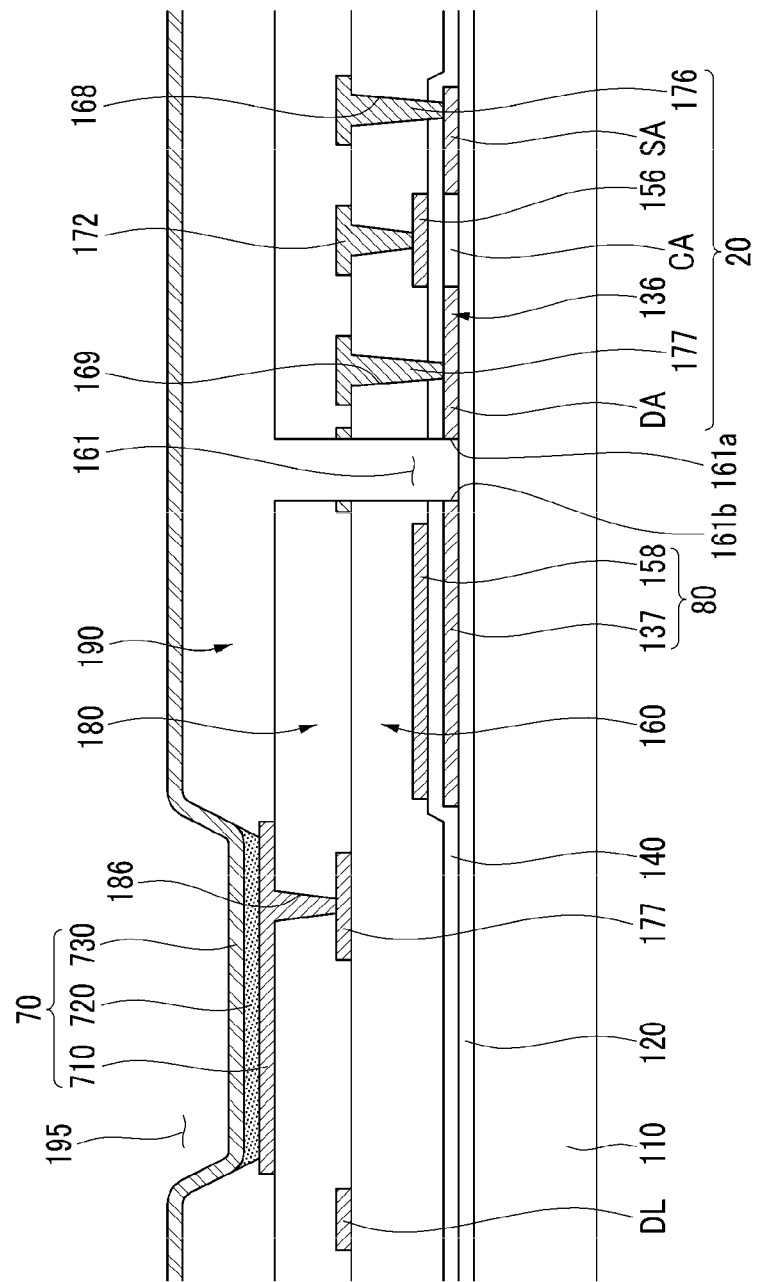

Thereafter, as shown in FIG. 17, a pixel defining layer 190 as the second insulation layer having a pixel opening 195 that exposes the first electrode 710 is formed on the planarization layer 180. In this case, the pixel defining layer 190 fills the first opening 161, the second opening 162, and the third opening 163 while being positioned on the gate insulating layer 140 and the interlayer insulating layer 160, which are the first insulation layer, and thus fills the space formed between the first semiconductor layer 136, the second semiconductor layer 137, and the third semiconductor layer 138.

As described above, until the first semiconductor layer 136, the second semiconductor layer 137, and the third semiconductor layer 138 are covered by the gate insulating layer 140 and the interlayer insulating layer 160 as a first insulation layer, the first semiconductor layer 136, the second semiconductor layer 137, and the third semiconductor layer 138 are integrally formed by the first bridge portion 131, the second bridge portion 132, and the third bridge portion 133, and thus even if an impact is applied to the first semiconductor layer 136, the second semiconductor layer 137, and the third semiconductor layer 138 by static electricity generated in a process, deterioration of the semiconductor characteristics of the first semiconductor layer 136, the second semiconductor layer 137, and the third semiconductor layer 138 is minimized. Further, even if the first semiconductor layer 136, the second semiconductor layer 137, and the third semiconductor layer 138 are formed in island forms that are separated from each other, the gate insulating layer 140 and the interlayer insulating layer 160 as the first insulation layer cover the first semiconductor layer 136, the second semiconductor layer 137, and the third semiconductor layer 138 and a pixel defining layer 190 as the second insulation layer is filled in the space that is formed between the first semiconductor layer 136, the second semiconductor layer 137, and the third semiconductor layer 138 and thus static electricity generated in a process is prevented from being applied to the first semiconductor layer 136, the second semiconductor layer 137, and the third semiconductor layer 138.

That is, in a method of manufacturing a display device according to the third exemplary embodiment shown in FIGS. 14 to 17, the first semiconductor layer 136, the second semiconductor layer 137, and the third semiconductor layer 138 are prevented from receiving an impact by static electricity that can be generated in a process, whereby semiconductor characteristics of the first semiconductor layer 136, the second semiconductor layer 137, and the third semiconductor layer 138 are not deteriorated. This operates as a factor of improving display quality of an entire display device.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A display device comprising:
   a substrate:
   a first semiconductor layer disposed on the substrate:
   a second semiconductor layer disposed on the substrate and adjacent to the first semiconductor layer:
   a first insulation layer disposed on the first semiconductor layer and the second semiconductor layer, the first insulation layer comprising a first opening corresponding to a space between the first semiconductor layer and the second semiconductor layer, the first opening not being the space between the first semiconductor layer and the second semiconductor layer; and
   a second insulation layer disposed on the first insulation layer and filling the first opening.

2. The display device of claim 1, wherein:
   the first opening is formed with a first inner surface, a second inner surface opposite to the first inner surface, third inner surface, and a fourth inner surface opposite to the third inner surface, the space being interposed between the first inner surface and the second inner surface and between the third inner surface and the fourth inner surface;
   the first inner surface is formed with the first semiconductor layer;
   the second inner surface is formed with the second semiconductor layer; and
   the third inner surface and the fourth inner surface are formed with the first insulation layer.

3. The display device of claim 1, wherein:
   the first insulation layer comprises:
      a first contact hole exposing a first portion of the first semiconductor layer; and
      a second contact hole exposing a second portion of the first semiconductor layer; the display device further comprises:
      a gate electrode disposed between the first semiconductor layer and the first insulation layer; and
      a source electrode and a drain electrode disposed between the first semiconductor layer and the second insulation layer; and
   the source electrode is connected to the first portion of the first semiconductor layer through the first contact hole of the first insulation layer, and the drain electrode is connected to the second portion of the first semiconductor layer through the second contact hole of the first insulation layer.

4. The display device of claim 3, further comprising a capacitor electrode disposed between the second semiconductor layer and the first insulation layer,
   wherein the capacitor electrode is positioned at the same layer as that of the gate electrode.

5. The display device of claim 4, further comprising a third semiconductor layer adjacent to the second semiconductor layer, wherein:
   the first insulation layer is disposed on the third semiconductor layer;
   the first insulation layer further comprises a second opening forming a second space between the second semiconductor layer and the third semiconductor layer; and
   the second insulation layer fills the second opening.

6. The display device of claim 5, wherein:
   the first semiconductor layer, the second semiconductor layer, and the third semiconductor layer form one pixel;
   the second semiconductor layer is adjacent to a second semiconductor layer of another pixel that is adjacent to the one pixel;
   the first insulation layer is disposed on the second semiconductor layer of the another pixel;
   the first insulation layer further comprises a third opening forming a third space between the second semiconductor layer and the second semiconductor layer of the another pixel; and
   the second insulation layer fills the third opening.

7. The display device of claim 6, further comprising:
   a first electrode connected to the drain electrode;
   an organic emission layer disposed on the first electrode; and
   a second electrode disposed on the organic emission layer.

8. A display device, comprising:
   a first semiconductor layer;
   a second semiconductor layer disposed in the same layer as the first semiconductor layer;
   a capacitor electrode disposed on the first semiconductor layer;
   a first insulating layer disposed between the capacitor electrode and the first semiconductor layer;
   an interlayer insulating layer comprising a first portion and a second portion, the first portion being disposed on the capacitor electrode, the second portion being disposed on the second semiconductor layer, the first portion being separated from the second portion by a first opening; and a second insulating layer disposed in the first opening, the second insulating layer contacting the first semiconductor layer and the second semiconductor layer.

9. The display device of claim 8, wherein the second insulating layer is disposed on the interlayer insulating layer.

10. The display device of claim 8, wherein the first opening comprises only the second insulating layer.

11. The display device of claim 8, wherein the first insulating layer is disposed between the second semiconductor layer and the second portion.

12. The display device of claim 8, wherein:
the first opening is formed with a first inner surface, a second inner surface opposite to the first inner surface, a third inner surface, and a fourth inner surface opposite to the third inner surface, the first opening being formed between the first inner surface and the second inner surface and between the third inner surface and the fourth inner surface;
the first inner surface is formed with a surface of the first semiconductor layer;
the second inner surface is formed with a surface of the second semiconductor layer; and
the third inner surface and the fourth inner surface are formed with surfaces of the first insulation layer.

13. The display device of claim 12, wherein the first opening is formed with a fifth inner surface and a sixth inner surface opposite to the fifth inner surface, the fifth inner surface and the sixth inner surface being formed with surfaces of the interlayer insulating layer.

* * * * *